(12) United States Patent
Beran et al.

(10) Patent No.: US 11,340,313 B2
(45) Date of Patent: May 24, 2022

(54) METHOD FOR EXAMINING A MAGNETIC FIELD SOURCE

(71) Applicant: Fraunhofer-Gesellschaft zur Förderung der angewandten Forschung e.V., Munich (DE)

(72) Inventors: Philip Beran, Erlangen (DE); Gerhard Tischlinger, Erlangen (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 92 days.

(21) Appl. No.: 16/683,333

(22) Filed: Nov. 14, 2019

(65) Prior Publication Data

US 2020/0158792 A1 May 21, 2020

(30) Foreign Application Priority Data

Nov. 16, 2018 (DE) .......................... 102018219722.9

(51) Int. Cl.
*G01R 33/02* (2006.01)
*H01F 7/02* (2006.01)

(52) U.S. Cl.
CPC ........... *G01R 33/02* (2013.01); *H01F 7/0294* (2013.01)

(58) Field of Classification Search
None
See application file for complete search history.

(56) References Cited

U.S. PATENT DOCUMENTS

| 7,295,007 B2* | 11/2007 | Dold | A61B 5/055 |
| | | | 324/307 |
| 2012/0032679 A1* | 2/2012 | Brereton | G01R 33/385 |
| | | | 324/322 |
| 2013/0057260 A1* | 3/2013 | Kim | G01R 33/0064 |
| | | | 324/207.11 |
| 2013/0303878 A1* | 11/2013 | Nevo | A61B 34/20 |
| | | | 600/409 |

FOREIGN PATENT DOCUMENTS

| DE | 19948686 A1 | 5/2001 |
| DE | 10003584 A1 | 8/2001 |

OTHER PUBLICATIONS

Beran, Philip, Wertvolle Informationen in Magnetfeldern. In: QZ Qualität und Zuverlässigkeit, Carl Hanser Verlag München, Jahrgang 63, 2018, 09, p. 80-82.

* cited by examiner

*Primary Examiner* — Douglas X Rodriguez
(74) *Attorney, Agent, or Firm* — Novick, Kim & Lee, PLLC; Jae Youn Kim; Jihun Kim (57) ABSTRACT

The invention relates to a method for examining a magnetic field source. In this case, the magnetic vector field emanating from the magnetic field source is detected in a first coordinate system and corresponding magnetic field data is generated. Furthermore, the geometrical body of the magnetic field source is geometrically detected in a second coordinate system and corresponding geometrical data is generated. Subsequently, the first and the second coordinate systems are transferred into a mutual coordinate system by means of a coordinate transformation and the magnetic field data and the geometrical data are combined within the mutual coordinate system in order to place the magnetic vector field of the magnetic field source and the geometrical (Continued)

body of the magnetic field source into a mutual positional relationship.

17 Claims, 5 Drawing Sheets

METHOD FOR EXAMINING A MAGNETIC FIELD SOURCE

CROSS-REFERENCE TO RELATED APPLICATION

This application claims priority from German Patent Application No. DE 10 2018 219 722.9, which was filed on Nov. 16, 2018, and is incorporated herein in its entirety by reference.

BACKGROUND OF THE INVENTION

The invention relates to a method for characterizing, or examining, a magnetic field source. For this, in embodiments, magnetic field data and geometrical data of a magnetic field source are collected and transferred into a mutual coordinate system. This enables the precise positional assignment of the magnetic vector field in relation to the geometry, i.e. to the geometrical body, of the magnetic field source.

Both, permanent magnets and other magnetic devices (e.g. coils) may be used as single magnetic components, and in particular as magnetic sources or encoders, for the assembly of total magnetic systems. These magnetic single components are used in large quantities, e.g. in machine technology or position sensor technology. For precise applications, the magnetic field of these encoders has to fulfill certain requirements and adhere to tolerances. Currently, these tolerances are specified in typical parameters at best, but many of the possible deviations are often entirely unknown. The typical cause is manufacturing tolerances with regard to geometry and material characteristics of the magnetic encoders (or transmitters, or generators). If detected, these deviations of the magnetic field lead to rejects when assembling the total magnetic system. Undetected, they lead to errors in the later use up to the failure of the total system.

The magnetic field caused by the encoder depends on many parameters such as manufacturing tolerances, contaminations and fluctuations of the material properties and, in the case of permanent magnets, on homogeneities and fluctuations in the magnetic field during the magnetization process. The influence of these error sources is difficult to control.

Today, there are magnetic inspection systems that may precisely measure the magnetic field of magnetic encoders. Such inspection systems are partially used for the initial inspection in order to identify erroneous magnetic sources based on their magnetic field. However, these inspection systems may only be used to check whether the magnetic field of a magnetic encoder is within a tolerance range or not.

Complete system inspections are currently more widespread in the industry, which may compensate for the manufacturing tolerances mentioned above. In this case, the total system is examined for proper functioning, wherein, in the worst case, unserviceability of the system is diagnosed and a large number of rejects is generated. Due to the full integration, the replacement of erroneous magnetic encoders in systems is not always possible and causes high costs. In the case of sensor systems, the calibration values for each system have to be determined in total system inspections that are mechanically complex. This process of calibration compensates for errors of the encoder; however, it may not completely compensate for excessive deviations from the nominal values, e.g. if an incorrect magnetic field has been applied to a magnet.

SUMMARY

According to an embodiment, a method for examining a magnetic field source may have the steps of: detecting the magnetic vector field emanating from the magnetic field source in a first coordinate system and generating magnetic field data, detecting the geometrical body of the magnetic field source in a second coordinate system and generating geometrical data, transferring the first and the second coordinate systems into a mutual coordinate system by means of a coordinate transformation and combining the magnetic field data and the geometrical data within the mutual coordinate system in order to place the magnetic vector field of the magnetic field source and the geometrical body of the magnetic field source into a mutual positional relationship.

Another embodiment may have a non-transitory digital storage medium having a computer program stored thereon to perform the method for examining a magnetic field source, the method having the steps of: detecting the magnetic vector field emanating from the magnetic field source in a first coordinate system and generating magnetic field data, detecting the geometrical body of the magnetic field source in a second coordinate system and generating geometrical data, transferring the first and the second coordinate systems into a mutual coordinate system by means of a coordinate transformation and combining the magnetic field data and the geometrical data within the mutual coordinate system in order to place the magnetic vector field of the magnetic field source and the geometrical body of the magnetic field source into a mutual positional relationship, when said computer program is run by a computer.

According to another embodiment, an apparatus for examining a magnetic field source may have: a magnetic field measurement apparatus for detecting the magnetic vector field emanating from the magnetic field source in a first coordinate system and for generating magnetic field data, an apparatus for detecting the geometrical body of the magnetic field source in a second coordinate system and for generating geometrical data, and a data processing unit for transferring the first and second coordinate systems into a mutual coordinate system by means of a coordinate transformation and for combining the magnetic field data and the geometrical data within the mutual coordinate system in order to place the magnetic vector field of the magnetic field source and the geometrical body of the magnetic field source into a mutual positional relationship.

According to the inventive method, the magnetic vector field emanating from a magnetic field source is determined within a first coordinate system. Based on this, magnetic field data linked to the first coordinate system is generated. This magnetic field data is suitable data to quantitatively and/or qualitatively describe the measured magnetic vector field. In a further step, the geometrical body of the magnetic field source is geometrically detected within a second coordinate system. A geometrical detection may be understood as detecting the geometrical body of the magnetic field source, and in particular, detecting the outer contours of the geometrical body of the magnetic field source, e.g. by means of measuring the body of the magnetic field source. Here, geometrical data that enables representing and/or modelling the measured geometrical body of the magnetic field source is generated. For example, the measured geometrical body of the magnetic field source may be modelled in a suitable data processing means. The model of the magnetic field source may be a two-dimensional model or a three-dimensional model. Geometrically detecting the magnetic field source takes place in a second coordinate system. On the other hand, the initially mentioned detection of the magnetic vector field takes place in the first coordinate system. The two coordinate systems may be an independent of each other, i.e. there is no relation between the two coordinate systems. For example, this may result from the fact that a magnetic field detection apparatus for detecting the magnetic vector field and a geometry detection apparatus for detecting the geometrical body of the magnetic field source are aligned in different orientations in relation to the magnetic field source. Accordingly, the magnetic field data describing the detected magnetic vector field and the geometrical data describing the detected geometrical body of the magnetic field source are initially independent, i.e. there is no relation between the two. In order to generate a relation, the first and the second coordinate systems are transferred into a mutual coordinate system by means of a coordinate transformation. The mutual coordinate system may either be the first or the second coordinate system. Alternatively or additionally, a third coordinate system may form the mutual coordinate system. In the coordinate transformation, the magnetic field data and the geometrical data are combined within the mutual coordinate system. Thus, the magnetic vector field of the magnetic field source and the geometrical body of the magnetic field source may be placed into a mutual positional relationship. For example, the magnetic vector field of the magnetic field source and the geometrical body of the magnetic field source may be overlapped with each other in a congruent manner, i.e. in the correct relative position to each other. Thus, by means of the coordinate transformation, a mutual reference system in which the detected magnetic vector field and the detected geometrical body of the magnetic field source are combined such as is the case in reality may be provided. The coordinate transformation may be applied to any measurement processes, regardless of the geometry of the magnetic field source to be measured. Thus, any magnetic field source may be quickly and precisely measured and characterized. A further advantage consists of the fact that measurements of arbitrary magnetic field sources performed separately later in time may be represented in and combined into a mutual coordinate system. In the inventive method, the exact position of the magnetic field source may be determined during the measurement, i.e. simultaneously to detecting the magnetic vector field and/or simultaneously to detecting the geometrical body. Through this approach, erroneous geometries and erroneous magnetizations may be quickly and simply identified.

BRIEF DESCRIPTION OF THE DRAWINGS

Embodiments of the present invention will be detailed subsequently referring to the ap-pended drawings, in which.

DETAILED DESCRIPTION OF THE INVENTION

In the following, embodiments are described in more detail with respect to the figures, wherein elements having the same or similar functions are provided with the same reference numerals.

The terms magnetic field source, source and magnetic encoder, or encoder, are synonymously used herein. In principle, everything that is described with respect to the magnetic field source 100 and the geometrical body 10 of the magnetic field source 100 also applies to the reference magnetic field source 100' and the geometrical body 10' of the reference magnetic field source 100', and vice versa.

Method steps that are illustrated in a block diagram and described with respect to the same may be performed in any other order than in the illustrated and/or described order. In addition, method steps concerning a certain feature of an apparatus are interchangeable with the same feature of the apparatus, and vice versa.

Figure 1:
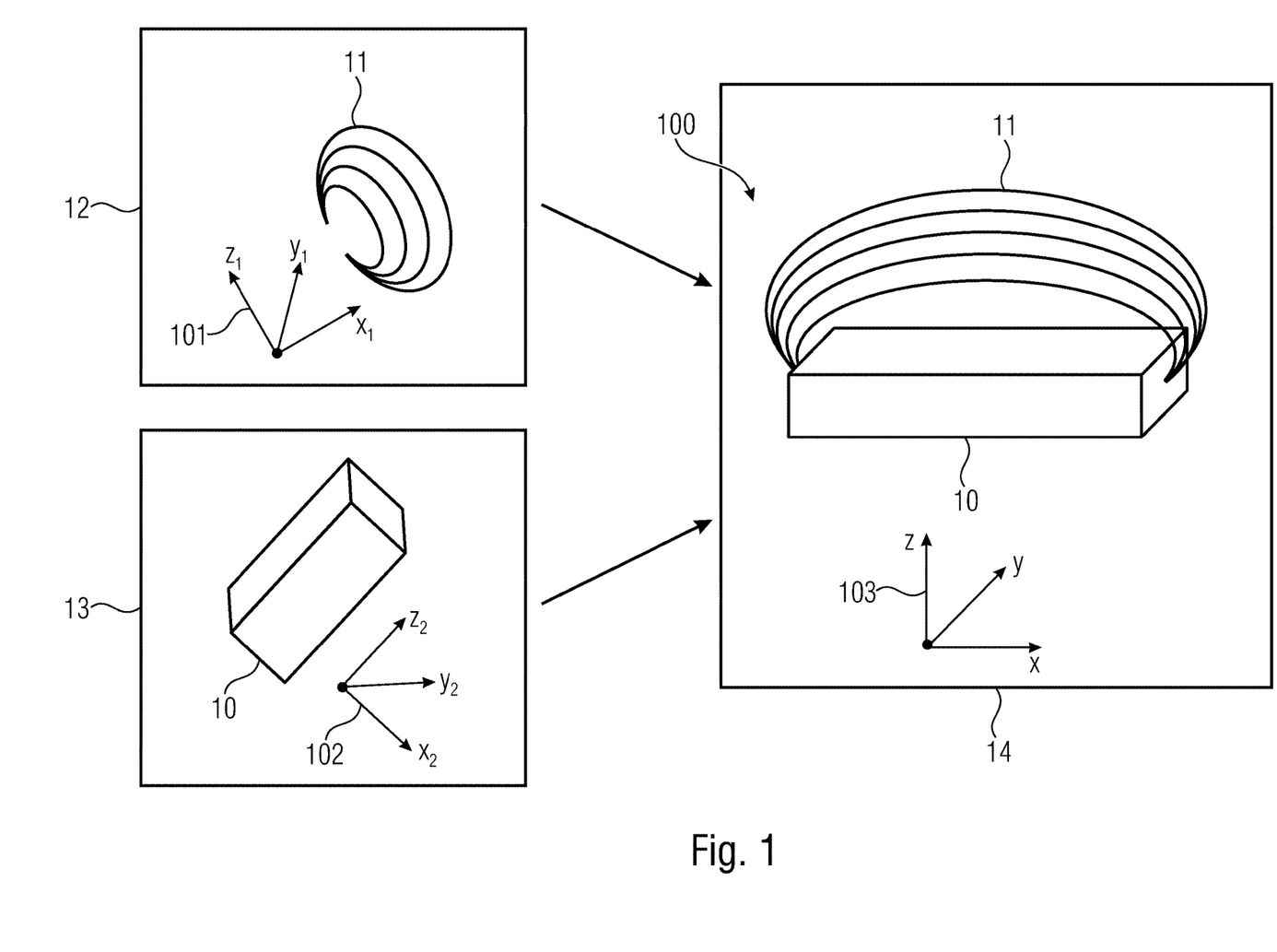
FIG. 1 shows a schematic illustration of the herein-described method for examining a magnetic field source according to an embodiment.

FIG. 1 shows a schematic representation of the inventive method for examining the magnetic field source 100 according to an embodiment.

In this example, the magnetic field source 100 is configured as a geometrical body in the shape of a cuboid 10. It is understood that the shape of the cuboid is only mentioned as a non-limiting example for representing the inventive method. Any other shapes of geometrical bodies of a magnetic field source 100 are generally conceivable.

The magnetic field source 100 itself may be magnetic or it may be suitably magnetized, e.g. by means of a permanent magnet or a coil array. The magnetic field source 100 generates a magnetic vector field 11. The magnetic vector field 11 emanating from the magnetic field source 100 may be detected by means of a magnetic field measurement apparatus 12. For example, such a magnetic field measurement apparatus 12 may comprise a moving magnetic field probe or a magnetic field camera that may measure the magnetic field vector in a location-resolved manner.

In particular, the magnetic field probe may be a 3D magnetic field measurement probe that may measure the magnetic field vector of the magnetic field source 100 at several locations in a three-dimensional space. In particular, the magnetic field camera may also be a 3D magnetic field camera that may measure the magnetic field vector of the magnetic field source 100 at several locations in a three-dimensional space.

The magnetic field measurement apparatus 12 is arranged in relation to the magnetic field source 100 at a certain distance and at a certain angle. Accordingly, the magnetic field measurement apparatus 12 comprises a first coordinate system 101 within which the magnetic vector field 11 may be detected. When detecting the magnetic vector field 11, magnetic field data quantitatively and/or qualitatively describing the magnetic vector field 11 in a suitable representation or data structure is generated. The magnetic field data describing the magnetic vector field 11 is linked the first coordinate system 101.

In a further method step, the geometrical body 10 of the magnetic field source 100 may be geometrically detected by means of a geometrical measurement apparatus 13. The geometrical body 10 is understood as the real three-dimensional shape, or structure, of the magnetic field source 100. The geometrical detection is understood as the detection of the real geometrical body 10 of the magnetic field source 100, e.g. by means of a measurement, which makes it possible to determine both the shape and the position of the geometrical body 10. For example, the geometrical measurement apparatus 13 may comprise an imagining apparatus such as a camera or an image sensor, a laser-based scanning apparatus, an X-ray apparatus, a MRT apparatus (MRT: magnetic resonance tomography), or any other combination thereof. Alternatively or additionally, the geometrical measurement apparatus 13 may comprise an apparatus for tactile detection of the geometrical body 10, e.g., which may determine the position and shape of the geometrical body 10 by means of probing.

The geometrical measurement apparatus 13 is arranged in relation to the magnetic field source 100 at a certain distance and at a certain angle. Accordingly, the geometrical measurement apparatus 13 comprises a second coordinate system 102 within which the geometrical body 10 of the magnetic field source 100 may be geometrically detected. When geometrically detecting the magnetic field source 100, geometrical data describing the geometrical body 10 of the magnetic field source 100 in a suitable representation is generated such that the geometrical body 10 may be represented or modelled. The geometrical data describing the geometrical body 10 of the magnetic field source 100 is linked to the second coordinate system 102.

For example, the geometrical data may represent the outer dimensions of the geometrical body 10 of the magnetic field source 100. Alternatively or additionally, the geometrical data of the geometrical body 10 of the magnetic field source 100 may represent the position and/or orientation in a three-dimensional space within the second coordinate system 102. In some embodiments, the outer dimensions and the orientation of the geometrical body 10 of the magnetic field source 100 may be linked. That is, based on the detection of the outer dimensions of the geometrical body 10 of the magnetic field source 100, the orientation of the geometrical body 10 of the magnetic field source 100 in the three-dimensional space within the second coordinate system 102 may be directly derived. In other words, when measuring the geometrical body 10 of the magnetic field source 100, its orientation in the space may be simultaneously determined. In the embodiment depicted in FIG. 1, the geometrical body 10 of the magnetic field source 100 has the shape of a cuboid that is obliquely orientated in the space, for example.

That is, with the inventive method, magnetic field data and geometrical data of the magnetic field source 100 may be generated. The magnetic field data is linked to the first coordinate system 101, and the geometrical data is linked to the second coordinate system 102. However, the two coordinate systems 101, 102 may initially be independent of each other. Thus, the position of the detected magnetic vector field 11 in the first coordinate system 101 may deviate from the position of the geometrical body 10 of the magnetic field source 100 in the second coordinate system 102.

A suitable coordinate transformation may now be performed in order to place the geometrical body 10 of the magnetic field source 100 and the magnetic vector field 11 of the magnetic field source 100 into a mutual positional relationship. In this case, the first and the second coordinate systems 101, 102 are transferred into a mutual coordinate system 103. In this case, the magnetic field data and the geometrical data are combined within the mutual coordinate system 103 such that the position of the geometrical body 10 of the magnetic field source 100 matches the position of the detected magnetic vector field 11.

Thus, the inventive method provides a complete characterization of the magnetic field source 100 and links its geometry to its magnetic vector field 11, as is symbolically indicated in the diagram provided with reference numeral 14.

In the coordinate transformation, the first or the second coordinate system 101, 102 may be used as a reference and may form the mutual coordinate system 103. That is, the first coordinate system 101 may be transferred into the second coordinate system 102, or vice versa, for example. Alternatively, the first and the second coordinate systems 101, 102 may be transferred into a mutual third coordinate system 103.

Figure 2:
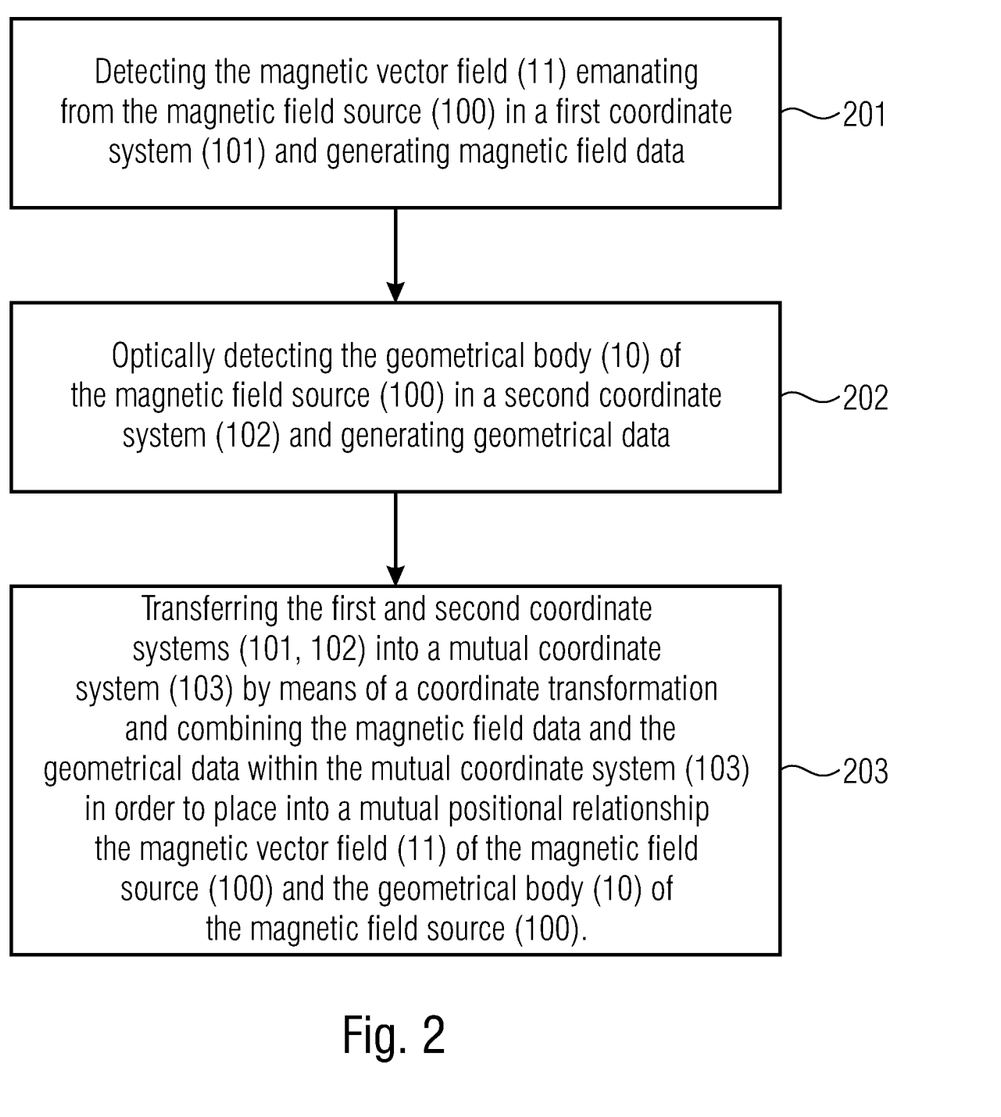
FIG. 2 shows a block diagram of the herein-described method according to an embodiment.

FIG. 2 shows a schematic block diagram of the herein-described method according to an embodiment.

In block 201, the magnetic vector field 11 emanating from the magnetic field source 100 is detected, namely within the first coordinate system 101. Based on this, corresponding magnetic field data describing the magnetic vector field 11 is generated.

In block 202, the geometrical body 10 of the magnetic field source 100 is detected, namely within the second coordinate system 102. Based on this, geometrical data describing the geometrical body 10 of the magnetic field source 100 is generated.

In block 303, the first and the second coordinate systems 101, 102 are transferred into a mutual coordinate system 103 by means of a coordinate transformation. As initially mentioned, one of the two coordinate systems 101, 102 may be used as a reference, i.e. as the mutual coordinate system 103. Alternatively, both coordinate systems 101, 102 may be transferred into a mutual third coordinate system 103. Then, within the mutual coordinate system 103, the magnetic field data and the geometrical data are combined. Thus, the magnetic vector field 11 of the magnetic field source 100 and the geometrical body 10 of the magnetic field source 100 may be placed into a mutual positional relationship.

The coordinate transformation is based on coordinate transformation parameters describing the transformation of the two coordinate systems 101, 102 into the mutual coordinate system 103. The coordinate transformation parameters describe the rotation and/or scaling and/or shearing of the coordinate system 101, 102 to be transformed.

Geometrical tolerances such as torsions or tilts of the measurement system in relation to the measurement surface may be determined independently in a magnetic or optical manner by means of the coordinate transformation. That is, the orientation of the magnetic field measurement apparatus 12 in relation to the magnetic field source 100 and the orientation of the geometrical measurement apparatus 13 in relation to the magnetic field source 100 may be represented in a mutual coordinate system 103. Thus, the coordinate transformation parameters describe the spatial deviation between the magnetic field measurement apparatus 12 and the geometrical measurement apparatus 13 in relation to the magnetic field source 100.

In order to determine the coordinate transformation parameters, the method may provide a calibration. This calibration may be performed at least once before measuring the actual magnetic field source 100.

Figure 3:
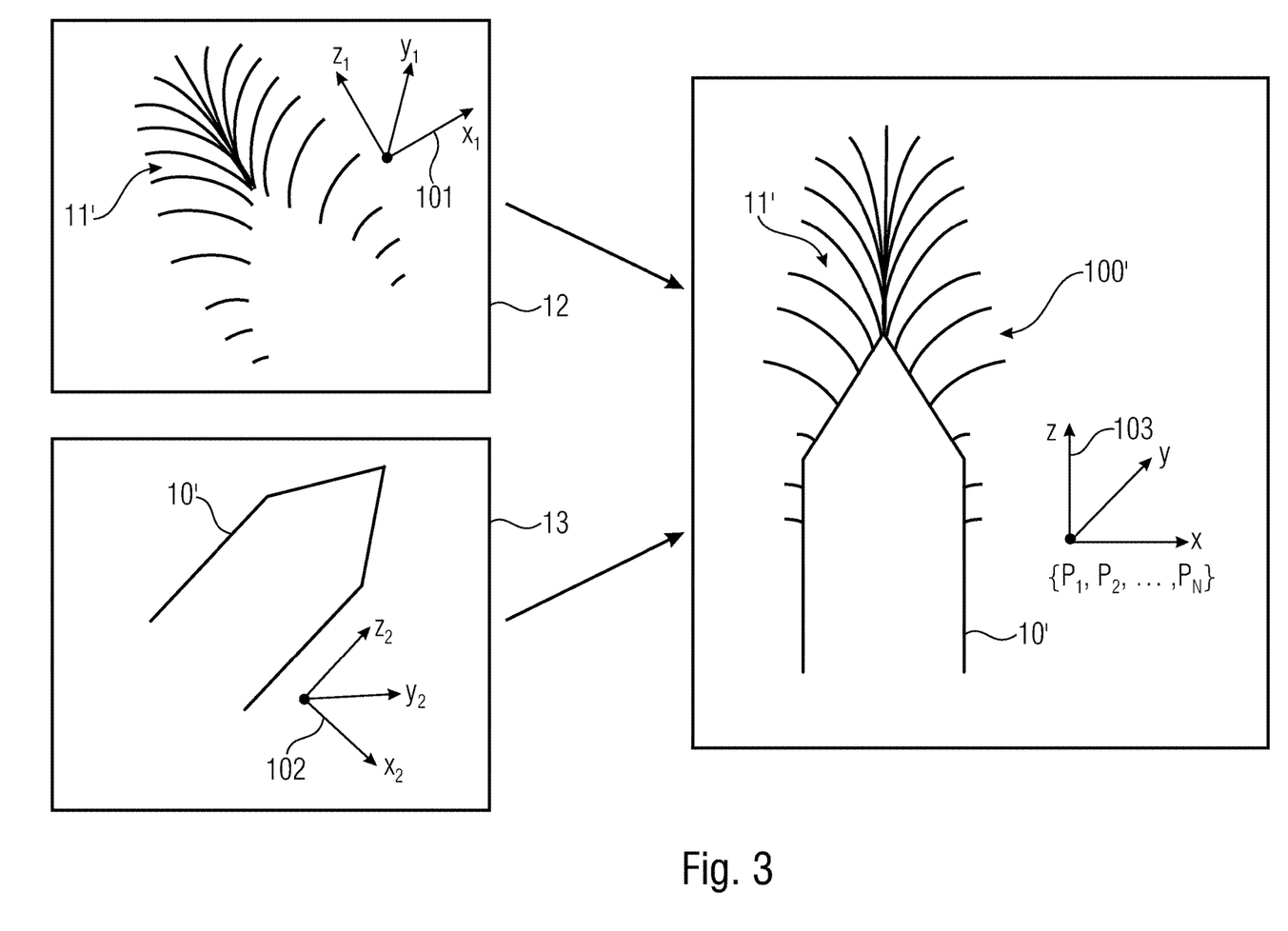
FIG. 3 shows a schematic illustration of the herein-described method according to an embodiment in which a reference magnetic field source is used for calibration.

FIG. 3 shows a schematic block circuit diagram for describing the calibration process that represents an embodiment of the method described herein.

A reference magnetic field source 100' is provided for the calibration. In particular, the geometrical body 10' of the reference magnetic field source 100' may comprise a geometrical shape that makes it possible to unambiguously identify the reference magnetic field source 100' by means of the geometrical measurement apparatus 13 and to determine the orientation of the geometrical body 10' of the reference magnetic field source 100' within the second coordinate system 102.

In other words, the method includes detecting the geometrical body 10' of the reference magnetic field source 100' and determining the orientation and/or position of the reference magnetic field source 100' within the second coordinate system 102 based on the detected geometrical body 10'.

For example, the detection of the geometrical body 10' may be performed using an imaging method such as a camera-based image identification, a laser-based scanning method, an X-ray method, a MRT method (MRT: magnetic resonance tomography), or a combination thereof. Alternatively or additionally, the detection of the geometrical body 10' may be performed using a tactile detection method, e.g., wherein the surface of the geometrical body 10' may be scanned. Based on the detection of the geometrical body 10', position and shape of the geometrical body 10' in the three-dimensional space may be derived. Obviously, this does not only apply for the geometrical body 10' of the reference magnetic field source 100', but also for the geometrical body 10 of the magnetic field source 100 to be determined.

The reference magnetic field source 100' exemplarily illustrated in FIG. 3 may further comprise a geometrical shape that generates a characteristic magnetic vector field 11'. Again, this makes it possible to unambiguously determine the magnetic vector field 11' of the reference magnetic field source 100' by means of the magnetic field measurement apparatus 12 and to determine the orientation of the magnetic vector field 11' of the reference magnetic field source 100' within the first coordinate system 101.

In other words, the method includes detecting a magnetic vector field 11' generated by the reference magnetic field source 100' and determining the orientation and/or position of the reference magnetic field source 100' within the first coordinate system 101 based on the detected magnetic vector field 11'.

For example, the reference magnetic field source 100' may comprise a structure in which the magnetic field lines comprise a characteristic course due to the fact that they are collimated (maximum) or scattered (minimum), for example. The reference magnetic field source 100' exemplarily illustrated in FIG. 3 comprises a rod-shaped geometrical body 10' having a tip. At this tip, the magnetic field lines exit in a collimated manner and, with increasing distance to the tip, are scattered further and further, leading to the exemplarily illustrated characteristic shape of the magnetic vector field 11'. In this case, a collimation of the magnetic field lines corresponds to a large field strength, or, in an extreme case, to a field strength maximum, and a scattering of the magnetic field lines corresponds to a low field strength, or, in an extreme case, to a field strength minimum.

Based on this characteristic shape of the magnetic vector field 11', the orientation of the reference magnetic field source 100' within the first coordinate system 101 may be unambiguously determined. Thus, for example, it may be determined that the tip of the geometrical body 10' has to be in the area in which the magnetic field lines occur in a collimated manner, while the remaining rod-shaped body has to be in an area in which the magnetic field lines are scattered. In other words, the step of determining the orientation and/or position of the reference magnetic field source 100' within the first coordinate system 101 may be performed based on a detection of the collimated and/or scattered magnetic field lines.

This shape of a tip exemplarily illustrated in FIG. 3 is also advantageous for the optical detection and the determination of the orientation and/or position of the reference magnetic field source 100' within the second coordinate system 102 based thereon.

In principal, the geometrical body 10' of the reference magnetic field source 100' may also comprise different shapes than the exemplarily mentioned tip. However, the geometrical shape of the reference magnetic field source 100' should allow the orientation and/or position of the reference magnetic field source 100' within the respective coordinate system 101, 102 to be determined as accurately as possible.

For example, the reference magnetic field source 100' could comprise a geometrical body 10' generating several distinct magnetic field minimums (i.e. scattering of the magnetic field lines) and/or magnetic field maximums (i.e. collimation of the magnetic field lines) whose position within the first coordinate system 101 may be unambiguously determined. Generally, the tighter the field lines, the higher the flux density.

Thus, based on a suitable selection of the reference magnetic field source 100', the orientation and/or position of the reference magnetic field source 100' in the first coordinate system 101, i.e. with respect to the magnetic field measurement apparatus 12, and in a second coordinate system 102, i.e. with respect to the geometrical measurement apparatus 13, may be determined by means of the method step of the calibration.

Now, based on this, coordinate transformation parameters $P_1, P_2, \ldots, P_N$ for the coordinate transformation may be determined in order to transfer the first coordinate system 101 and the second coordinate system 102 into the mutual coordinate system 103. In other words, the coordinate transformation parameters $P_1, P_2, \ldots, P_N$ therefore describe the geometrical offset (e.g. torsion, tilt, shift) between the magnetic field measurement apparatus 12 and the geometrical measurement apparatus 13 respectively in relation to the reference magnetic field source 100'. The coordinate transformation parameters $P_1, P_2, \ldots, P_N$ may be used to compensate this geometrical offset.

These coordinate transformation parameters $P_1, P_2, \ldots, P_N$ generated in the calibration step may be subsequently used for the herein-described concept of measuring arbitrary magnetic field sources 100. In this case, the coordinate transformation parameters $P_1, P_2, \ldots, P_N$ describe exactly the transformation needed to place the magnetic vector field 11, which may be determined by means of the magnetic field measurement apparatus 12, of a magnetic field source 100 to be measured and the geometrical body 10, which may be determined by means of the geometrical measurement apparatus 13, of this magnetic field source 100 into a mutual positional relationship.

As a result, the magnetic vector field 11 and the geometrical body 10 of the magnetic field source 100 to be measured are combined in the correct orientation relative to one another.

A large advantage of this is that measurements of arbitrary magnetic field sources 100 that are separately performed later on may be represented and merged into a mutual coordinate system 103. Thus, after calibrating the entire measurement system once, the position of the individual measurement units (i.e. magnetic field measurement apparatus 12 and geometrical measurement apparatus 13) may be transferred to further measurements. As initially mentioned, this embodiment of the herein-described method corresponds to a calibration of the measurement system with respect to a mutual coordinate system 103. When measuring an arbitrary magnetic object, the resulting data set corresponds to the geometrical and magnetic characterization of the magnetic field source 100.

According to a further embodiment, detecting the magnetic vector field 11 may be performed in at least one spatial plane within the first coordinate system 101. That is, the magnetic vector field 11 may at least be measured two-dimensionally by means of the magnetic field measurement apparatus 12.

Alternatively or additionally, the magnetic vector field 11 may also be measured three-dimensionally. In other words, detecting the magnetic vector field 11 may be performed across a volume within the first coordinate system 101.

In this case, detecting the magnetic vector field 11 may be performed across at least one octant of a volume around the magnetic field source 100 within the first coordinate system 101. According to a further embodiment, detecting the magnetic vector field 11 may be performed across all octants of a volume around the magnetic field source 100 within the first coordinate system 101. Obviously, the same also applies to the reference magnetic field source 100'. Detection across all eight octants provides a highly exact and realistic result of representing the magnetic vector field 11, 11'.

For example, the magnetic vector field 11, 11' may be detected by means of a movable magnetic field probe, and in particular by means of a 3D magnetic field probe, which is a non-limiting example of a magnetic field measurement apparatus 12. Alternatively or additionally, the magnetic vector field 11, 11' may be detected by means of a magnetic field camera, and in particular by means of a 3D magnetic field camera, which is a further non-limiting example of a magnetic field measurement apparatus 12. Such a magnetic field camera generates a resolved measurement of the magnetic field vector at several locations in a three-dimensional space. In this case, the magnetic field lines of the magnetic vector field of the magnetic source 100, or of the reference magnetic source 100', may be detected and optionally visualized.

Such a magnetic field camera 12 is used for performing the herein-described method, particularly since all components of the magnetic field of the magnetic field source 100, 100' may be determined by means of the magnetic field camera 12, e.g., on an area of a 16×16 pixel array, wherein each pixel measures the magnetic field vector. In addition, with a high measurement speed, dynamic measurements that may measure and map the magnetic vector field 11, 11' in real time may be made possible.

According to an embodiment, the geometrical body 10, 10' of the magnetic field source 100, 100' may be optically detected by means of an imaging apparatus, which is a non-limiting example of a geometrical measurement apparatus 13. For example, the imaging apparatus 13 may be a camera, or only an image sensor. The imaging apparatus 13 may be combined with pattern recognition. Pattern recognition makes it possible to identify the geometrical body 10, 10' of the magnetic field source 100, 100' and to determine its orientation and/or position within the second coordinate system 102.

Alternatively or additionally, the geometrical body 10, 10' of the magnetic field source 100, 100' may be detected by means of laser scanning. For this, a laser scanner may be used, which is a non-limiting example of a geometrical measurement apparatus 13. A laser scanner may three-dimensionally scan the geometrical body 10, 10' of the magnetic field source 100, 100' and may generate a three-dimensional representation, or a three-dimensional model, of the scanned body 10, 10'. The three-dimensional scan provides a very accurate and realistic result of the geometrical body 10, 10' of the magnetic field source 100, 100'.

According to a further embodiment, the geometrical measurement apparatus 13 may comprise a tactile scanning apparatus. For example, with such a scanning apparatus, the surface of the geometrical body 10, 10' may be scanned in a tactile manner. For example, based on this tactile scan, a (three-dimensional) model of the scan geometrical body 10, 10' may be created.

For example, the outer dimensions, e.g. length and/or width and/or height of the geometrical body 10, 10' of the magnetic field source 100, 100', may be geometrically detected by means of the geometrical measurement apparatus 13, no matter if in an optical or tactile manner. Thus, in a three-dimensional scan, the entire geometrical body 10, 10' of the magnetic field source 100, 100' may be detected in the three-dimensional space, i.e. within the second coordinate system 102, for example. Thus, the orientation and/or position of the geometrical body 10, 10' of the magnetic field source 100, 100' in the three-dimensional space, i.e. within the second coordinate system 102, may be directly inferred.

According to a further conceivable embodiment, the detected magnetic vector field 11, 11' and the geometrically detected geometrical body 10, 10' of the magnetic field source 100, 100' may be visualized. For this, FIG. 4 shows a schematically illustrated example.

Here, a cuboid-shaped magnetic field source 100 was geometrically detected and visualized with the method described herein. In this case, the geometrical body 10 of the magnetic field source 100 was geometrically detected, e.g. in an optical manner by means of laser scanning, and the magnetic vector field 11 was detected at several locations in the space by means of a location-resolved measurement of the magnetic field vector.

The detected geometrical body 10 and the detected magnetic vector field 11 were transformed into a mutual coordinate system 103 by means of a suitable coordinate transformation whose transformation parameters were determined in a previous step of calibration. The detected geometrical body 10 and the detected magnetic vector field 11 may be visualized within the mutual coordinate system 103.

Figure 4:
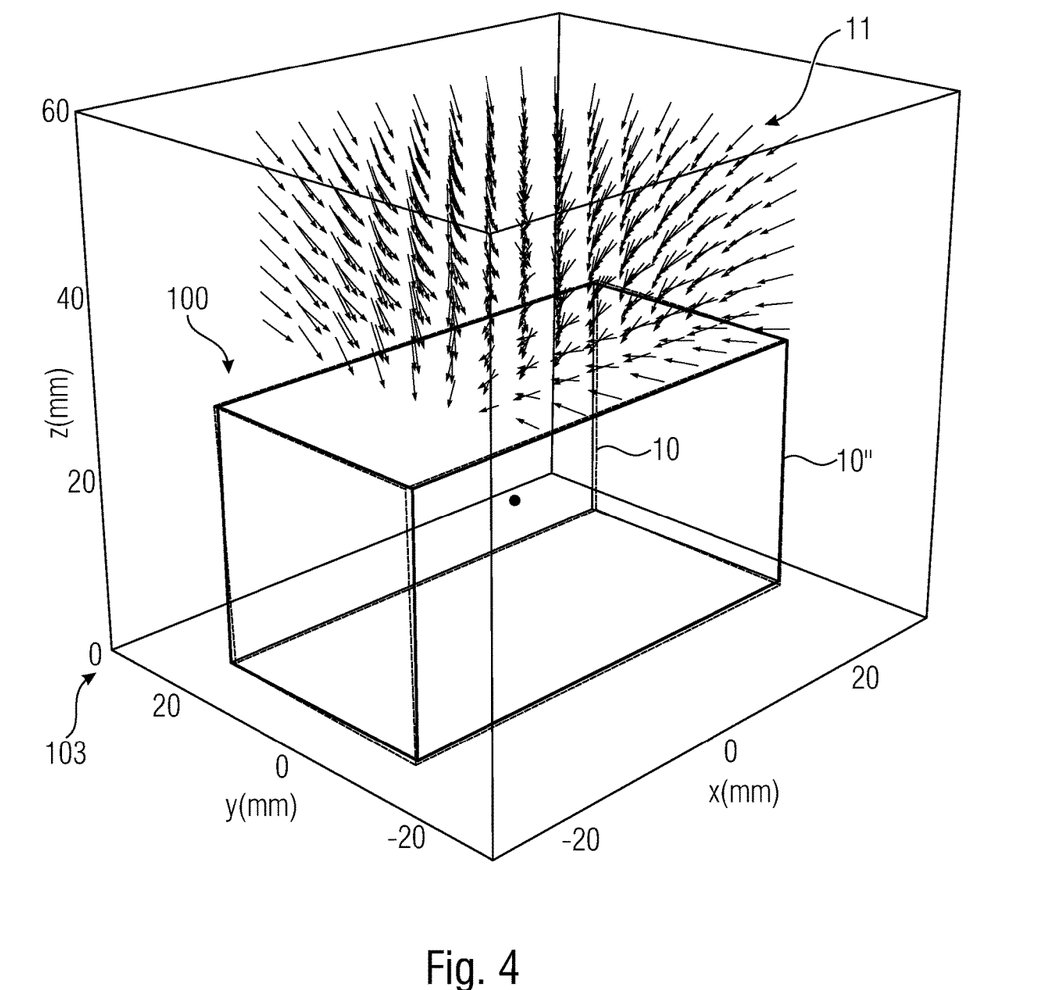
FIG. 4 shows a schematic illustration of the herein-described method according to an embodiment in which the detected magnetic vector field and the geometrically detected geometrical body of the magnetic field source are visualized.

The dashed lines illustrated in FIG. 4 represent the geometrically detected geometrical body 10 of the magnetic field source 100. On the other hand, the solid lines represent the nominal geometry (e.g. according to a data sheet) of the geometrical body 10 of the magnetic field source 100. This nominal geometry may also be visualized in the mutual coordinate system 103.

Deviations between nominal value and actual value in the geometry of the geometrical body 10 of the magnetic field source 100 may be determined by means of the method described herein. In addition, the actual position of the magnetic vector field 11 in relation to the geometrical body 10 of the magnetic field source 100 may be determined. With this knowledge, e.g., erroneous magnetizations of the real magnetic field source 100 may be detected.

Figure 5:
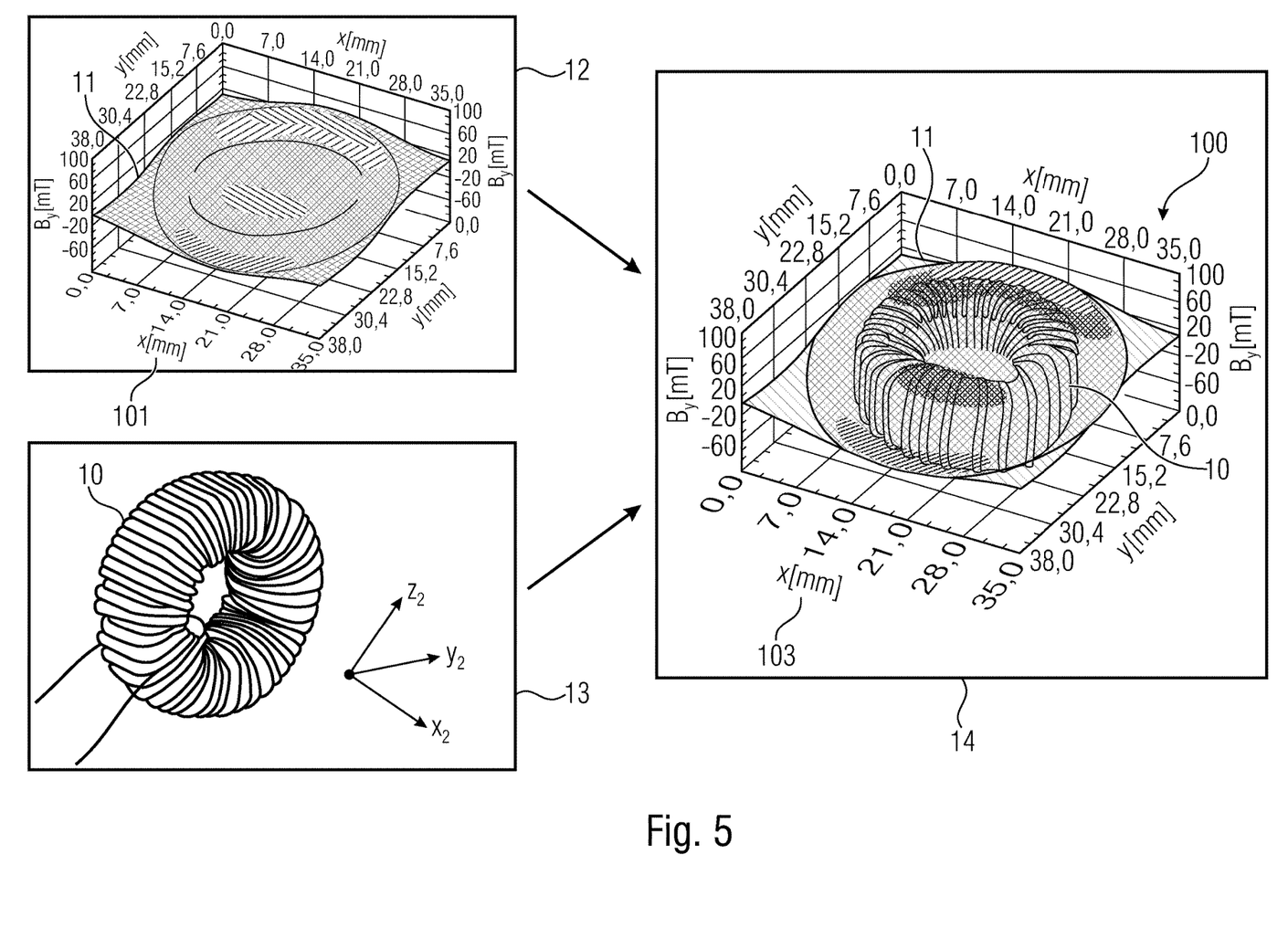
FIG. 5 shows a further schematic illustration of the herein-described method according to an embodiment in which the detected magnetic vector field and the geometrically detected geometrical body of the magnetic field source are visualized.

FIG. 5 shows a further example of the method described herein, wherein a toroid coil serves as the magnetic field source 100 to be measured.

For example, the magnetic vector field 11 of the toroid coil 100 may be detected by means of a magnetic field camera 12, advantageously in a three-dimensional manner, within the first coordinate system 101. The visualization of the detected magnetic vector field 11 may then also be carried out in a three-dimensional manner within the first coordinate system 101.

The geometrical body 10 of the toroid coil 100 is geometrically detected and may then, e.g., be optically detected by means of a camera or a laser scanner. The detection by means of a laser scanner is advantageous since it may be used to generate a model of the scanned geometrical body 10 of the toroid coil 100. Advantageously, this is a three-dimensional model. As is schematically indicated in FIG. 5 based on the illustrated toroid coil 10, this model may then be visualized. In this case, the model is generated within the second coordinate system 102.

The coordinate transformation may be performed based on the coordinate transformation parameters $P_1, P_2, \ldots, P_N$ that may be determined by means of a preceding one-time calibration in order to transfer the first and the second coordinate system 101, 102 into a mutual coordinate system 103. In this case, the geometrically detected geometrical body 10 as well as the magnetic vector field 11 may be mutually visualized and may be visually overlapped. For example, this may take place in a suitable data processing means 14.

Therefore, the method described herein provides a possibility to characterize an arbitrary magnetic object by congruently placing the geometrical body 10 of the respective magnetic field source 100 and its generated magnetic vector field 11 into a mutual positional relationship (mutual coordinate system 103).

The exemplary description based on a three-dimensional characterization also applies to the two-dimensional characterization of magnetic field sources using the method described herein.

In the following, the invention is summarized in other words:

The method described herein makes it possible to completely measure and characterize a magnetic field 11 and a geometry 10 of an encoder (magnetic field source) 100. This complete geometrical/magnetic characterization makes it possible to determine the positional relationship between the detected magnetic vector field 11 and the optically detected geometry 10 and/or an orientation of the magnetic field source 100 in a three-dimensional space. Thus, the magnetic vector field 11 may be aligned in relation to the geometry, i.e. to the geometrical body 10 of the magnetic field source 100.

The method described herein includes a combination of the physically separated measurement methods and processes of a geometrical and magnetic measurement of a magnetic field source 100. The two separated measurements are for example: First, a suitable geometry measurement by which the geometrical dimensions and the three-dimensional shape 10 of the encoder 100 and its orientation in the three-dimensional space may be measured. Second, a measurement of the magnetic vector field 11 with a moving magnetic field probe or with a so-called magnetic field camera.

In this case, the magnetic field 11 may be determined vectorially at least within one plane or across a volume. By means of extending this characterization to all sides of the magnetic field source 100, or all octants of the volume around the magnetic field source 100, a complete characterization of the magnetic encoder may be realized.

However, a problem with separately performed measurements is that the positional relationship of the individual measurements may only be determined by the mechanical precision of the total system. With the method described herein, it is now possible to unambiguously represent, or combine, the two separately performed measurement methods independently of the mechanical precision of the total system in a mutual reference system 103.

By means of a geometrical and magnetic determination of the position of a mutual measurement object (magnetic field source) 100, the typically separated coordinate systems 101, 102 may be merged by a magnetic and geometrical detection unit, which may enable the unambiguous merger of the two measurement results.

According to an advantageous embodiment, for mutually referencing the two separately performed measurements, a suitable reference measurement object (reference magnetic field source) 100' is used, whose position and orientation in the three-dimensional space may be precisely measured in a magnetic and geometrical manner. Thus, such a reference object (reference magnetic field source) 100' is itself magnetic or is suitably magnetized and, in the ideal case, has several distinct magnetic maximums or minimums whose positions may be unambiguously magnetically determined and are also geometrically (e.g. optically or in a tactile manner) unambiguously measureable by selecting a suitable geometry 10'.

For example, such a reference object (reference magnetic field source) 100' may be a magnetic tip in which the magnetic field lines 11 are suitably collimated due to the geometry 10 of the tip 100, which makes it possible to determine the position of the tip 100 both magnetically and also geometrically, e.g. optically.

When using several such reference measurement objects (reference magnetic field sources) 100', their positions may be determined at several locations, which makes it possible to determine the positional relationships of the respective measurement systems with respect to each other for all degrees of freedom. Thus, geometrical tolerances such as torsions or tilts of the measurement system may be magnetically or geometrically determined in relation to the measurement surface in an independent manner. By representing these reference measurement objects (reference magnetic field sources) 100' in both units, a mutual origin of the coordinate systems 101, 102 may be found and their positional relationship may be identified.

A great advantage of this method is that measurements of arbitrary objects (magnetic field sources) 100 separately performed later on may be represented and merged in a mutual coordinate system 103. Thus, after a one-time "calibration" of the measurement system, the position of the measurement units may be transferred to further measurements. In principle, this method corresponds to an additional calibration of the measurement system with respect to a mutual coordinate system 103. When measuring an arbitrary magnetic object (magnetic field source) 100, the resulting data set corresponds to the geometrical and magnetic characterization of the magnetic field source 100. By extending this characterization to all sides of the source 100, or all octants of the volume around the source 100, a complete characterization of the magnetic encoder 100 may be realized.

Complete measurement and characterization of the magnetic field 11, as well as the position and the geometry of the magnetic field source 100, make it possible to ensure a later functionality prior to installing it into a total system. All errors caused by manufacturing tolerances of the encoder 100 are known in advance, which enables an early quality control. This enables a classification and selection of magnets and coils (magnetic field sources) 100 and makes it possible to omit a later calibration of the system, since the exact vector field 11 in relation to the geometry 10 is known. Mechanical manufacturing tolerances which the system comprises or which may arise during the installation may be unambiguously separated from those of the magnetic encoder (magnetic field source 100). In this regard, the method described herein provides that the magnetic encoders (magnetic field sources) 100 may be measured both geometrically and magnetically.

By a pre-selection of magnetic components, rejects during manufacturing of magnetic systems may be significantly reduced, in turn decreasing the manufacturing costs. Possible cost decreases may be achieved in the entire manufacturing process and may also be achieved in further components of the total system. A possibly complex exchange of the magnetic components is omitted, increasing the efficiency. Simultaneously, an increased quality may be achieved by means of tightly tolerated magnetic components. In sensor systems, correction factors may be determined without complex total system evaluations. In addition, quality improvement is possible by means of tightly tolerated components.

According to the method described herein, data belonging to a magnetic component 100 and containing magnetic and geometrical components is provided. That is, as soon as measured data containing magnetic and geometrical components is provided to a magnetic encoder 100, the herein-described method for referencing geometrical and magnetic measurements was used.

Alternatively, providing different characterization parameters would be possible, e.g. by means of the mathematical description of a magnetic field source 100. In this way, however, it is somewhat more difficult to mathematically represent real measured values without the non-idealities detected and to bring them in line with reality.

Applications are conceivable in all typical areas of mechanical engineering and in materials technology using magnetic components. For example, these include classic applications using magnets, such as generators and electric motors. Also conceivable is an application in mechanical engineering in the manufacturing of magnetic encoders (magnetic field sources) as well as the control and monitoring of the manufacturing process of magnetic materials.

In addition, numerous applications of the magnetic field sensor technology are conceivable. For example, position sensor technology (linear sensor technology, angular sensor technology), current sensor technology, inertial sensor technology and force sensor technology.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device.

Some or all of the method steps may be performed by a hardware device (or using a hardware device), such as a microprocessor, a programmable computer or an electronic circuit. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier. In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded. The data carrier, the digital storage medium, or the recorded medium are typically tangible, or non-volatile.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU), or may be hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for examining a magnetic field source having a geometrical body, comprising:
    detecting a magnetic vector field emanating from the magnetic field source in a first coordinate system and generating magnetic field data;
    detecting the geometrical body of the magnetic field source in a second coordinate system and generating geometrical data; and
    transferring the first and the second coordinate systems into a mutual coordinate system by means of a coordinate transformation and combining the magnetic field data and the geometrical data within the mutual coordinate system in order to place the magnetic vector field of the magnetic field source and the geometrical body of the magnetic field source into a mutual positional relationship.

2. The method according to claim 1, wherein, before performing the method, the following steps are performed at least once:
    providing a reference magnetic field source;
    detecting a magnetic vector field generated by the reference magnetic field source and determining an orientation and/or a position of the reference magnetic field source within the first coordinate system based on the detected magnetic vector field;
    detecting a geometrical body of the reference magnetic field source and determining an orientation and/or a position of the reference magnetic field source within the second coordinate system based on the detected geometrical body; and
    determining coordinate transformation parameters for the coordinate transformation for transferring the first coordinate system and the second coordinate system into the mutual coordinate system based on determining the orientation and/or position of the reference magnetic field source.

3. The method according to claim 2, wherein the reference magnetic field source comprises several distinct magnetic field minimums and/or magnetic field maximums whose positions within the first coordinate system are determined unambiguously,
    and wherein determining the orientation and/or position of the reference magnetic field source within the first coordinate system is performed based on detecting at least one of the several distinct magnetic field minimums and/or magnetic field maximums.

4. The method according to claim 2, wherein the reference magnetic field source comprises a geometrical body at which magnetic field lines of the magnetic vector field are collimated and/or scattered,
    and wherein determining the orientation and/or position of the reference magnetic field source within the first coordinate system is performed based on detecting the collimated and/or scattered magnetic field lines.

5. The method according to claim 1, wherein detecting the magnetic vector field is performed by means of a movable magnetic field probe.

6. The method according to claim 1, wherein detecting the magnetic vector field is performed by means of a magnetic field camera.

7. The method according to claim 1, wherein detecting the magnetic vector field is performed in at least one spatial plane within the first coordinate system.

8. The method according to claim 1, wherein detecting the magnetic vector field is performed across a volume within the first coordinate system.

9. The method according to claim 8, wherein detecting the magnetic vector field is performed across at least one octant of a volume around the magnetic field source and/or around a reference magnetic field source within the first coordinate system.

10. The method according to claim 8, wherein detecting the magnetic vector field is performed across all octants of a volume around the magnetic field source and/or around a reference magnetic field source within the first coordinate system.

11. The method according to claim 1, wherein detecting the geometrical body comprises detecting outer dimensions of the geometrical body and/or detecting a position of the geometrical body within the second coordinate system and/or detecting an orientation of the geometrical body within the second coordinate system.

12. The method according to claim 1, wherein detecting the geometrical body comprises detecting in an optical manner by means of an imaging method and/or detecting in a tactile manner by means of a scanning apparatus for scanning an outer contour of the geometrical body.

13. The method according to claim 12, wherein detecting the geometrical body in an optical manner is performed by means of a laser scan.

14. The method according to claim 12, wherein detecting the geometrical body in an optical manner is performed by means of an imaging apparatus and pattern recognition.

15. The method according to claim 1,
    wherein detecting the magnetic vector field is performed by means of a magnetic field camera and the detected magnetic vector field is visualized,
    wherein detecting the geometrical body is performed by means of a laser scan and the detected geometrical body is visualized,
    and wherein the visualized magnetic vector field and the visualized geometrical body are placed into a mutual positional relationship by means of the coordinate transformation and are mutually visualized.

16. A non-transitory digital storage medium having a computer program stored thereon to perform a method for examining a magnetic field source having a geometrical body, when said computer program is run by a computer, the method comprising:
    detecting a magnetic vector field emanating from the magnetic field source in a first coordinate system and generating magnetic field data;

detecting the geometrical body of the magnetic field source in a second coordinate system and generating geometrical data; and transferring the first and the second coordinate systems into a mutual coordinate system by means of a coordinate transformation and combining the magnetic field data and the geometrical data within the mutual coordinate system in order to place the magnetic vector field of the magnetic field source and the geometrical body of the magnetic field source into a mutual positional relationship.

17. An apparatus for examining a magnetic field source having a geometrical body, the apparatus comprising:

a magnetic field measurement apparatus for detecting a magnetic vector field emanating from the magnetic field source in a first coordinate system and for generating magnetic field data;

an apparatus for detecting the geometrical body of the magnetic field source in a second coordinate system and for generating geometrical data; and a data processor for transferring the first and second coordinate systems into a mutual coordinate system by means of a coordinate transformation and for combining the magnetic field data and the geometrical data within the mutual coordinate system in order to place the magnetic vector field of the magnetic field source and the geometrical body of the magnetic field source into a mutual positional relationship.

* * * * *